(12) United States Patent
Kleijnen et al.

(10) Patent No.: US 12,044,371 B2
(45) Date of Patent: Jul. 23, 2024

(54) LED LIGHTING STRIP WITH BENT WIRES

(71) Applicant: LUMILEDS LLC, San Jose, CA (US)

(72) Inventors: Christian Kleijnen, Ell (NL); Florent Grégoire Monestier, Kerkrade (NL); Barbara Roswitha Mulders, Aachen (DE); Tobias Kurth, Aachen (DE); Georg Friedrich Alfons Henninger, Aachen (DE)

(73) Assignee: LUMILEDS, LLC, San Jose, CA (US)

( * ) Notice: Subject to any disclaimer, the term of this patent is extended or adjusted under 35 U.S.C. 154(b) by 0 days.

(21) Appl. No.: 17/939,650

(22) Filed: Sep. 7, 2022

(65) Prior Publication Data
US 2023/0073875 A1    Mar. 9, 2023

Related U.S. Application Data

(60) Provisional application No. 63/241,349, filed on Sep. 7, 2021.

(51) Int. Cl.
*F21S 4/22*     (2016.01)
*F21S 41/141*   (2018.01)
*F21V 23/00*    (2015.01)
*F21Y 115/10*   (2016.01)

(52) U.S. Cl.
CPC .............. *F21S 4/22* (2016.01); *F21S 41/141* (2018.01); *F21V 23/001* (2013.01); *F21Y 2115/10* (2016.08)

(58) Field of Classification Search
CPC ... F21V 23/001; F21S 4/20; F21S 4/22; F21S 4/24; F21S 41/141
See application file for complete search history.

(56) References Cited

U.S. PATENT DOCUMENTS

| 4,728,751 | A | 3/1988 | Canestaro et al. |
| 9,706,646 | B2* | 7/2017 | Jiang ...................... H05K 1/181 |
| 11,121,122 | B2 | 9/2021 | Kleijnen et al. |
| 2003/0071581 | A1 | 4/2003 | Panagotacos et al. |
| 2019/0279969 | A1* | 9/2019 | Mülders ................. H01L 25/075 |
| 2020/0025342 | A1 | 1/2020 | Kleijnen et al. |
| 2020/0027863 | A1* | 1/2020 | Kleijnen .................. F21V 23/06 |

FOREIGN PATENT DOCUMENTS

| EP | 3537041 A1 | 9/2019 |
| WO | 2017/157753 | 9/2017 |
| WO | 2018/108676 | 6/2018 |
| WO | 2020/016076 | 1/2020 |

OTHER PUBLICATIONS

International Search Report and Written Opinion mailed Dec. 6, 2022 for PCT International Application No. PCT/ US2022/042778.

* cited by examiner

*Primary Examiner* — Evan P Dzierzynski
*Assistant Examiner* — Nathaniel J Lee
(74) *Attorney, Agent, or Firm* — Volpe Koenig

(57) ABSTRACT

An LED lighting strip, method of manufacturing an LED lighting strip and an automotive lighting system are described. The LED lighting strip includes at least two outer wires, at least one central wire between the two outer wires, LEDs arranged along the LED lighting strip and electrically coupled at least to the at least two outer wires, and an enclosing member enclosing the at least two outer wires, the at one central wire and the LEDs. The at least two outer wires and the least one central wire have a bend in sections between at least some adjacent LEDs.

16 Claims, 6 Drawing Sheets

LED LIGHTING STRIP WITH BENT WIRES

CROSS REFERENCE TO RELATED APPLICATIONS

This application claims the benefit of U.S. Provisional Patent Application No. 63/241,349, which was filed on Sep. 7, 2021, the contents of which are hereby incorporated by reference herein.

BACKGROUND

Light emitting diodes (LEDs), which may encompass all semiconductor light emitting devices including, for example, diode lasers, more and more replace older technology light sources due to superior technical properties, such as energy efficiency and lifetime. One possibility for using LEDs may be to arrange them longitudinally in a lighting strip made up of wires, the LEDs, an enclosing member that includes, for example, silicone rubber, and possible further elements, such as for optical and electrical purposes. Such lighting strips can be made bendable and twistable with a rather homogenous light emission, which may make them ideal for vehicle applications in signal and styling lighting as they can follow smoothly, for example, a car body's outer contour.

SUMMARY

An LED lighting strip, method of manufacturing an LED lighting strip and an automotive lighting system are described. The LED lighting strip includes at least two outer wires, at least one central wire between the two outer wires, LEDs arranged along the LED lighting strip and electrically coupled at least to the at least two outer wires, and an enclosing member enclosing the at least two outer wires, the at one central wire and the LEDs. The at least two outer wires and the least one central wire have a bend in sections between at least some adjacent LEDs.

BRIEF DESCRIPTION OF THE DRAWINGS

A more detailed understanding can be had from the following description, given by way of example in conjunction with the accompanying drawings wherein.

DETAILED DESCRIPTION

Figure 1:
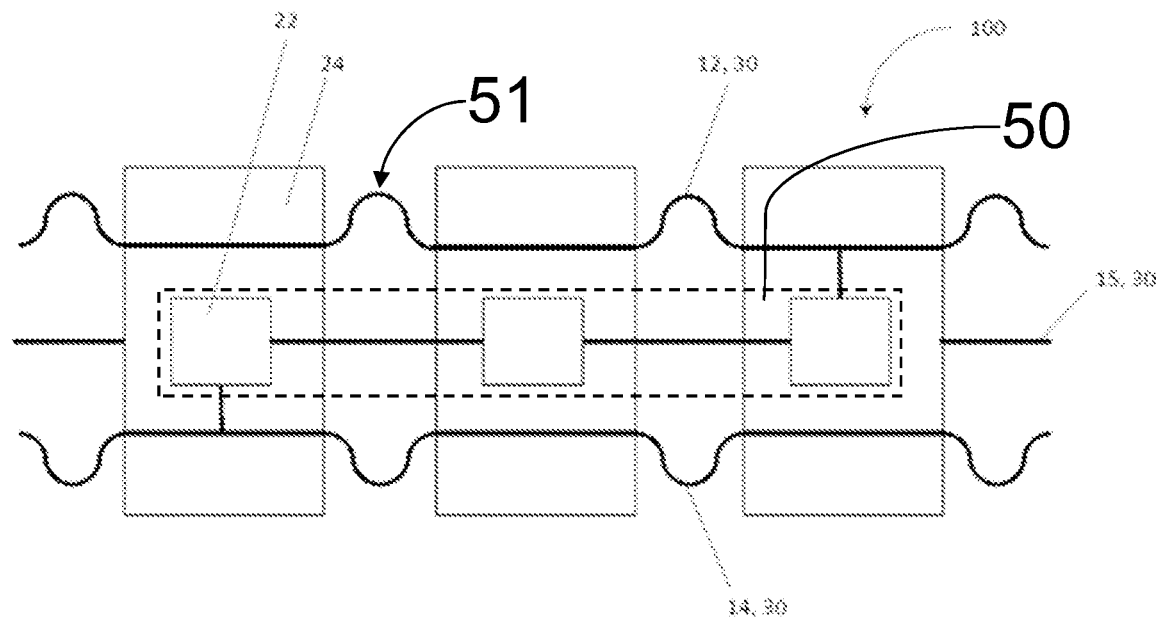
FIG. 1 is a schematic top view of a section of an example LED lighting strip.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present disclosure. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures, unless explicitly stated otherwise. It will be understood that these terms are intended to encompass different orientations of the device in addition to the orientation depicted in the figures.

Bendable and twistable LED lighting strips for vehicle signal and styling lights are under development and partially already available in the market. Such LED lighting strips may generate high market interest due to their offering of highly flexible design options at an affordable price by using a scalable system concept. By way of example, as a basic design block, a small (e.g., 10 mm long) LED lighting strip may be used. If longer strips are desired, multiples of such design blocks can be joined up to a maximum length. The final strip may be completed by adding beginning and end parts to the design and adding an electrical connector for plugging into the cars electrical system. WO2020016076A1 of the same applicant, hereby incorporated by reference herein, describes the construction principle and basic manufacturing method for such an LED lighting strip.

FIG. 1 is a schematic top view of an example LED lighting strip or a section 100 of such an LED lighting strip where similar sections may be added to continue the full LED lighting strip to the left and the right of the section 100 shown. In the example illustrated in FIG. 1, the LED lighting strip includes three wires 30, of which two are outer wires, the cathode wire 14 and the anode wire 12. A third one of the three wires may be a central wire 15. LEDs 22 may be arranged along the strip to build up a longitudinal LED lighting strip. The LEDs 22 may be directly connected to the wires 30 or, as shown in FIG. 1, may be mounted on carriers 24 or interposers to which the wires 30 may be connected. The wires 30 may be continuous or may be segmented. For example, they may include wire segments connected, for example, by soldering to pads of the carriers 24.

FIG. 1 shows three consecutive LEDs 22 arranged in a group 50 and being electrically coupled in series between the outer wires 12, 14 via the central wire 15. Iterating the section shown in FIG. 1 to the left and right may, thus, yield consecutive LED groups 50, with the LEDs 22 within each group 50 being in electrical series connection, and the groups 50 being electrically parallel to each other between the outer wires 12, 14.

A bend 51 may be formed in the outer wires 12, 14 between the LEDs 22 for building zones that are capable to receive compressive and/or tensile stress. These bends may support the bendability and twistability of the LED lighting strip, which may stress the outer wires 12, 14.

While the LED lighting strip illustrated in FIG. 1 may perform well in many situations, in some setups, the strip may suffer reliability issues. Such issues may be alleviated, for example, by adding one or more additional bends between at least some of the LEDs 22 in the central wire 15.

Figure 2:
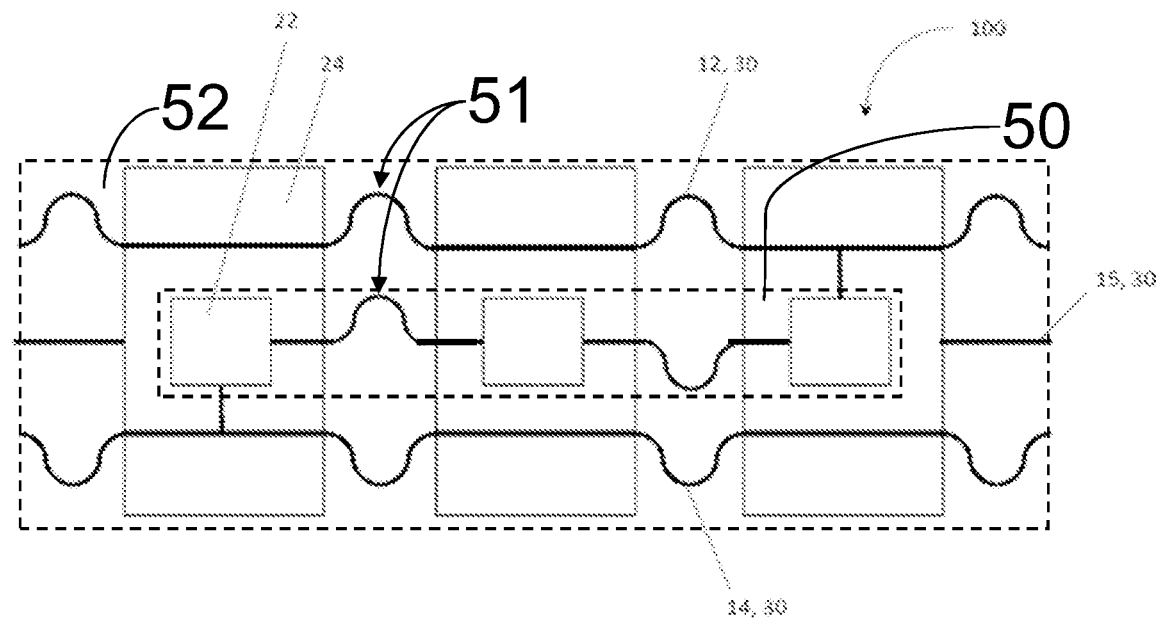
FIG. 2 is a schematic top view of a section of an another example LED lighting strip.

FIG. 2 is a schematic view of another example LED lighting strip. In the example illustrated in FIG. 2, bends 51 are included in the central wire 15 between adjacent LEDs. The example illustrated in FIG. 2 also includes an enclosing member 52 of the LED lighting strip 100 that may enclose the wires 30 and the LEDs 22 and the carriers 24.

While the bends 51 in the outer wires 12, 14 may provide sufficient flexibility for the bendability and twistability of the LED lighting strip. However, while a straight central wire 15 as used in FIG. 1 may be sufficient with respect to the bendability and twistability of the LED lighting strip, the thermal expansions of the constituents of the LED lighting strip may be different depending on changing ambient temperatures and switching on and off the LEDs of the strip. For example, the thermal expansion of the enclosing member 52, which may be formed from or include a silicone rubber, and the thermal expansion of the central wire 15, which may be formed from or include copper or a copper alloy such as CuFe2P or CuNiSi, may present an issue in some situations that may be alleviated by introducing bends 51 in the central wire 15.

Bends 51 may be included between each of the consecutive LEDs 22 or carriers 24 or only between some of them. Additionally, bends 51 between two consecutive LEDs 22 or carriers 24 may exist in both outer wires 12, 14 and the central wire 15 or only in some or just one of them. This may depend on the particular situation. For example, there may be a straight part of the LED strip (e.g., a part where bendability and/or twistability may not be required and, thus, no bends may be needed. Additionally or alternatively, there may be a part of the LED strip where bendability may only be required in one direction. Thus, for one-sided bendability, one of the outer wires 12, 14 may be straight without a bend 51. Additionally or alternatively, there may be a part of the LED strip where the power and/or density of the LEDs is low enough that little waste heat may be generated and the thermal stress from LED operation on that part of the LED strip may be low. From thermal stress, that part of the LED strip may work with the outer and central wires 12, 14, 15 being all without bends 51.

Where bends 51 exist, their relative orientation in the outer and central wires 12, 14, 15 may depend on the particular situation and may be advantageously chosen to be in the same or in different directions. FIG. 2 shows some examples choices for the upwards and downwards orientation of the bends 51. However, within the bending and twisting range specified for the strip, a minimum distance should be maintained between the outer and central wires 12, 14, 15 to avoid an electrical breakthrough between them. Thus, in the flexible lighting strip illustrated in FIG. 1, the orientation of the bends 51 of the outer wires 12, 14 may deliberately have been chosen in opposite directions to keep a maximum distance to the straight central wire 15 also on bending and twisting.

Bends 51 may not be constrained to lying in the same plane and may not be, in particular, constrained to being in the plane of the carriers 24. Using different planes for the bends 51 may further increase twistability and bendability and may increase distance and, thus, improve electrical insulation between the outer and central wires 12, 14, 15. As an example, the bends 51 of the outer wires 12, 14 may be contained in the plane of the carriers 24 while the bends 51 of the central wire 15 may be perpendicular to such plane. As said, as long as the necessary distance between wires is maintained during bending and twisting, many bend shapes are within the scope of the embodiments described herein.

Figure 3:
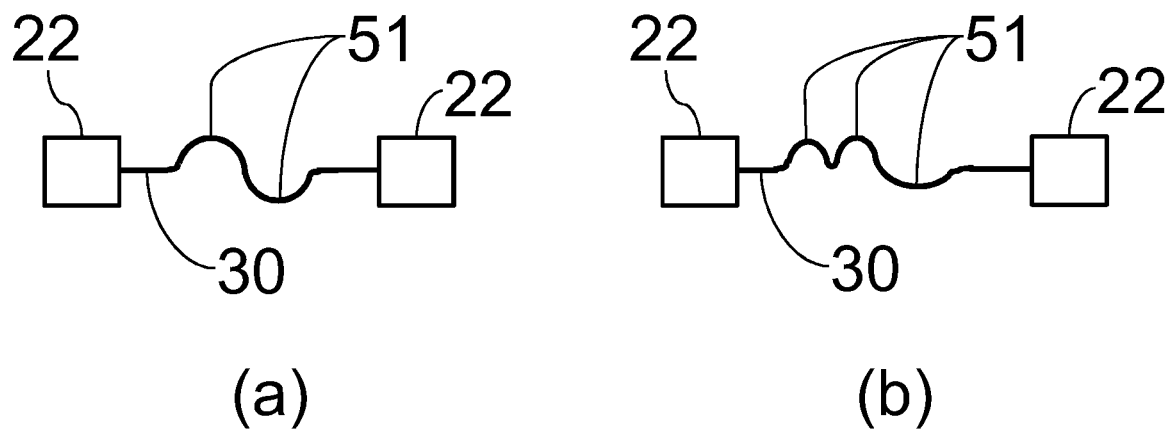
FIG. 3 is a schematic view showing various numbers and shapes of bends between consecutive LEDs in an example LED lighting strip.

FIG. 3 is a schematic view showing various embodiments (a) and (b) of bend shapes with two and three bends 51 in the wire 30 between consecutive LEDs 22. As previously mentioned, these bends, depending on the particular situation, may have various shapes and (absolute and relative) orientations.

Figure 4:
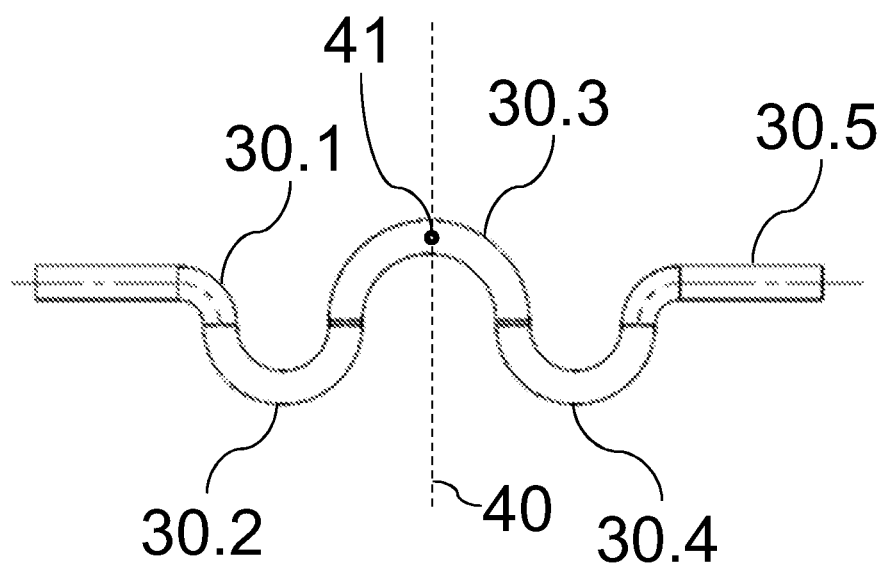
FIG. 4 is a schematic view of an example wire shape with bends.

For mechanical stability, bendability, and twistability, using multiple, smoothly joining bends in the wires 30 may be desirable. FIG. 4 is a schematic view showing the bends of a wire made up of five circular arcs 30.1, 30.2, 30.3, 30.4, 30.5 joining without any kinks (e.g., with the tangents of joining circular arcs in the joining point being identical). Furthermore, for obtaining a homogenous strip, as shown in FIG. 4, the bends may be mirror symmetric about a middle axis 40 through a midpoint 41 of the wire in between the LEDs and/or carriers joined by the wire.

Figure 5:
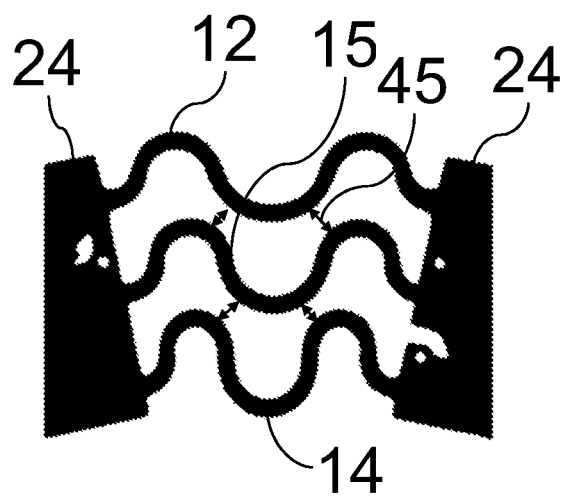
FIG. 5 is an X-ray top view of a bended part of an example LED lighting strip.

FIG. 5 is an X-ray top view of a part of a downward bended LED strip showing parts of left and right located carriers 24 with the outer and central wires 12, 14, 15 in between. All the wires have an identical shape of a central downwards bend enclosed by two neighboring upwards bends. The figure shows that using an identical shape for all the three wires may make the wires on bending move in the same direction. This may enable a minimum distance 45 to be kept between neighboring wires to avoid electrical breakthrough.

Figure 6:
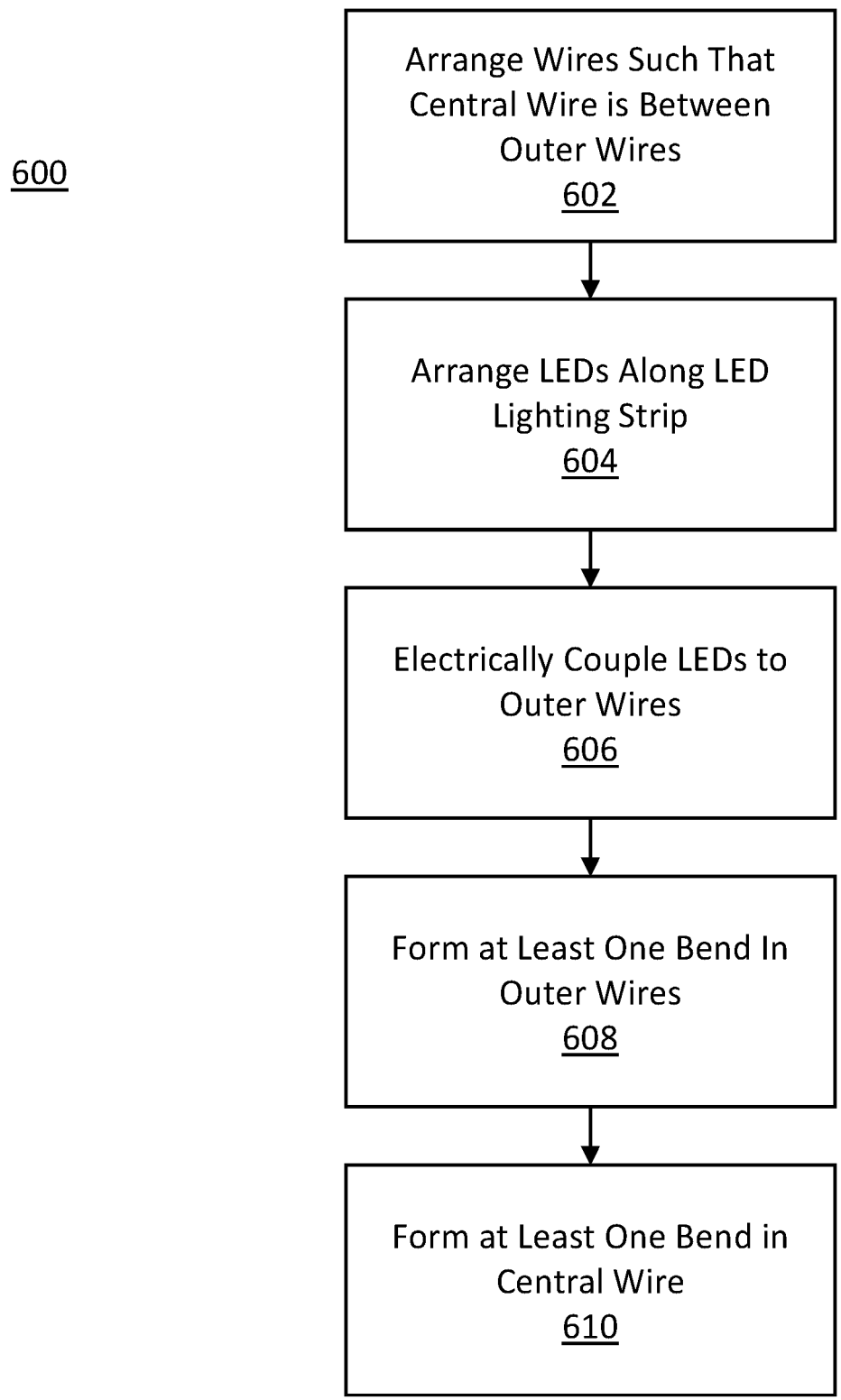
FIG. 6 is a flow diagram of an example method of manufacturing an LED lighting strip, such as the LED lighting strip of FIGS. 2, 3 and/or 4.

FIG. 6 is a flow diagram of an example method 600 of manufacturing an LED lighting strip. In the example illustrated in FIG. 6, the method includes arranging wires such that a central wire is between outer wires (602). In some embodiments, there may be at least two outer wires and at least one central wire. A plurality of LEDs may be arranged along the LED lighting strip (604). The plurality of LEDs may be electrically coupled to the outer wires (606). At least one bend may be formed in the outer wires (608). The at least one bend may be formed in sections between at least some adjacent LEDs. At least one bend may be formed in the central wire (610). The at least one bend may be formed in sections between the at least some of the adjacent LEDs. The bends may be formed in sections between adjacent LEDs in all of the wires or in just some. The bends may have different shapes or the same shape or may be formed in different directions or the same direction. In some embodiments, multiple bends may be formed in each section or just a single bend. The bends may take a number of different shapes, including the ones specifically shown and described herein with respect to FIGS. 2 and 3.

Figure 7:
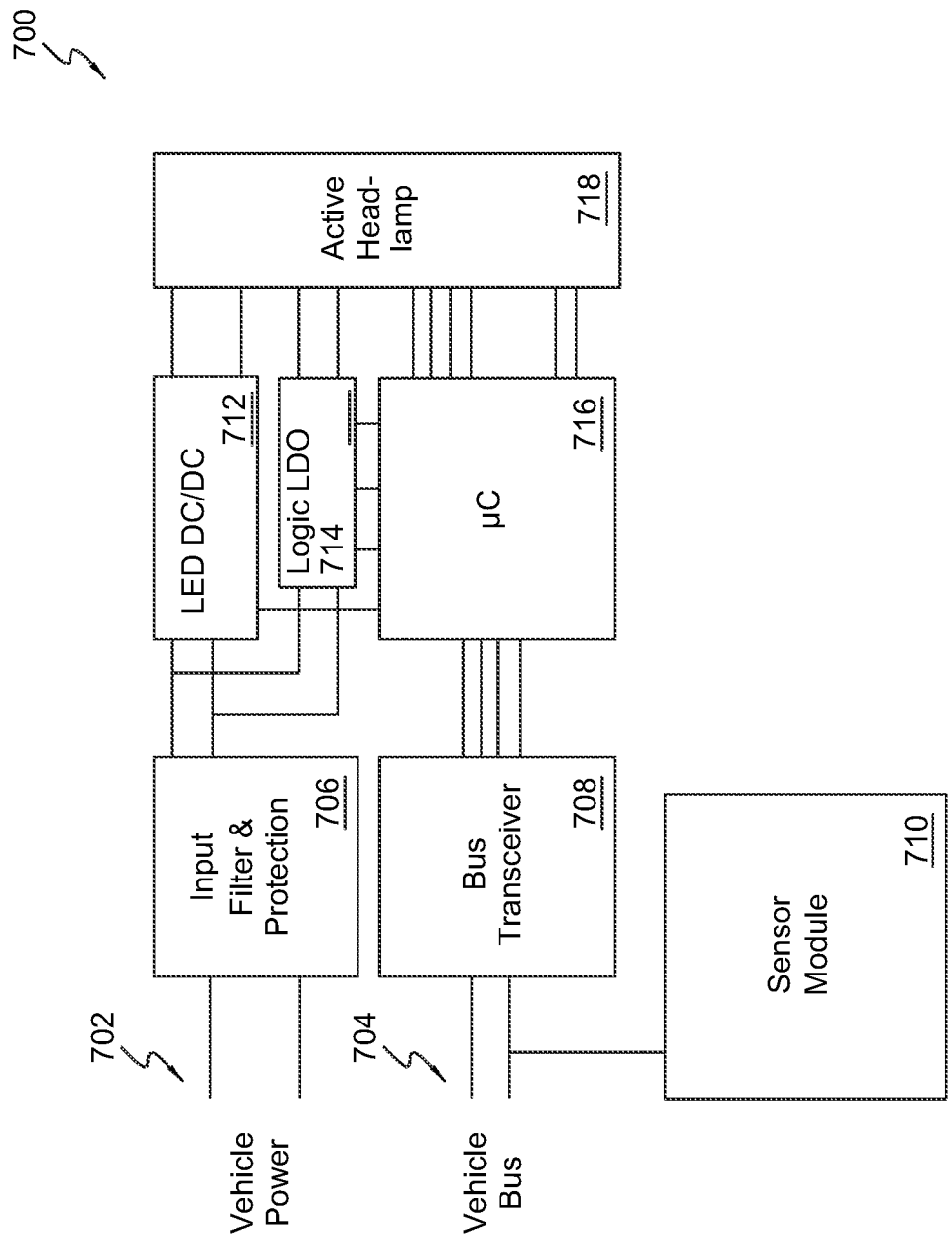
FIG. 7 is a diagram of an example vehicle headlamp system that may incorporate one or more of the embodiments and examples described herein.
Figure 8:
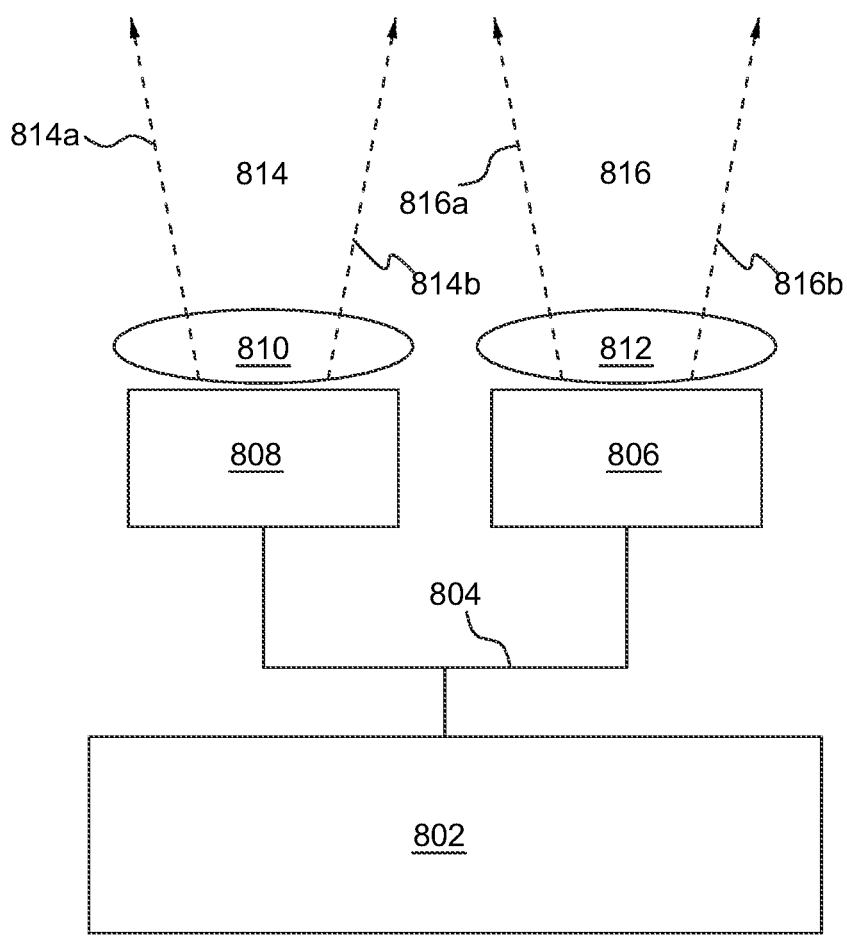
FIG. 8 is a diagram of another example vehicle headlamp system.

As mentioned, the LED lighting strip described herein may be used in any application where a three-dimensionally bendable LED light strip may be desirable, such as for use in automotive lighting applications. FIGS. 7 and 8 below are examples of an automotive lighting system that may be used, for example, for headlights. One of ordinary skill in the art will understand that similar systems may be used, for example, for signaling or styling lighting, or other applications wherein the LED lighting strip may be desirable.

FIG. 7 is a diagram of an example vehicle headlamp system 700 that may incorporate one or more of the embodiments and examples described herein. The example vehicle headlamp system 700 illustrated in FIG. 7 includes power lines 702, a data bus 704, an input filter and protection module 706, a bus transceiver 708, a sensor module 710, an LED direct current to direct current (DC/DC) module 712, a logic low-dropout (LDO) module 714, a micro-controller 716 and an active head lamp 718.

The power lines 702 may have inputs that receive power from a vehicle, and the data bus 704 may have inputs/outputs over which data may be exchanged between the vehicle and the vehicle headlamp system 700. For example, the vehicle headlamp system 700 may receive instructions from other locations in the vehicle, such as instructions to turn on turn signaling or turn on headlamps, and may send feedback to other locations in the vehicle if desired. The sensor module 710 may be communicatively coupled to the data bus 704 and may provide additional data to the vehicle headlamp system 700 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 700. In FIG. 7, the headlamp controller may be a micro-controller, such as micro-controller (μc) 716. The micro-controller 716 may be communicatively coupled to the data bus 704.

The input filter and protection module 706 may be electrically coupled to the power lines 702 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 712 may be coupled between the input filter and protection module 106 and the active headlamp 718 to receive filtered power and provide a drive current to power LEDs in the LED array in the active headlamp 718. The LED DC/DC module 712 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 714 may be coupled to the input filter and protection module 706 to receive the filtered power. The logic LDO module 714 may also be coupled to the micro-controller 716 and the active headlamp 718 to provide power to the micro-controller 716 and/or electronics in the active headlamp 718, such as CMOS logic.

The bus transceiver 708 may have, for example, a universal asynchronous receiver transmitter (UART) or serial peripheral interface (SPI) interface and may be coupled to the micro-controller 716. The micro-controller 716 may translate vehicle input based on, or including, data from the sensor module 710. The translated vehicle input may include a video signal that is transferrable to an image buffer in the active headlamp 718. In addition, the micro-controller 716 may load default image frames and test for open/short pixels during startup. In embodiments, an SPI interface may load an image buffer in CMOS. Image frames may be full frame, differential or partial frames. Other features of micro-controller 716 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

FIG. 8 is a diagram of another example vehicle headlamp system 800. The example vehicle headlamp system 800 illustrated in FIG. 8 includes an application platform 802, two LED lighting systems 806 and 808, and secondary optics 810 and 812.

The LED lighting system 808 may emit light beams 814 (shown between arrows 814a and 814b in FIG. 8). The LED lighting system 806 may emit light beams 816 (shown between arrows 816a and 816b in FIG. 8). In the embodiment shown in FIG. 8, a secondary optic 810 is adjacent the LED lighting system 808, and the light emitted from the LED lighting system 808 passes through the secondary optic 810. Similarly, a secondary optic 812 is adjacent the LED lighting system 806, and the light emitted from the LED lighting system 806 passes through the secondary optic 812. In alternative embodiments, no secondary optics 810/812 are provided in the vehicle headlamp system.

Where included, the secondary optics 810/812 may be or include one or more light guides. The one or more light guides may be edge lit or may have an interior opening that defines an interior edge of the light guide. LED lighting systems 808 and 806 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 808 and 806 in a desired manner, such as, for example, with a gradient, a chamfered distribution, a narrow distribution, a wide distribution, or an angular distribution.

The application platform 802 may provide power and/or data to the LED lighting systems 806 and/or 808 via lines 804, which may include one or more or a portion of the power lines 702 and the data bus 704 of FIG. 7. One or more sensors (which may be the sensors in the vehicle headlamp system 800 or other additional sensors) may be internal or external to the housing of the application platform 802. Alternatively, or in addition, as shown in the example vehicle headlamp system 700 of FIG. 7, each LED lighting system 808 and 806 may include its own sensor module, connectivity and control module, power module, and/or LED array.

In embodiments, the vehicle headlamp system 800 may represent an automobile with steerable light beams where LEDs may be selectively activated to provide steerable light.

For example, an array of LEDs or emitters may be used to define or project a shape or pattern or illuminate only selected sections of a roadway. In an example embodiment, infrared cameras or detector pixels within LED lighting systems 806 and 808 may be sensors (e.g., similar to sensors in the sensor module 710 of FIG. 7) that identify portions of a scene (e.g., roadway or pedestrian crossing) that require illumination.

As would be apparent to one skilled in the relevant art, based on the description herein, embodiments of the present invention can be designed in software using a hardware description language (HDL) such as, for example, Verilog or VHDL. The HDL-design can model the behavior of an electronic system, where the design can be synthesized and ultimately fabricated into a hardware device. In addition, the HDL-design can be stored in a computer product and loaded into a computer system prior to hardware manufacture.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light-emitting diode (LED) lighting strip comprising:
   first outer wire and a second outer wire;
   at least one central wire between the first and second outer wires;
   a plurality of LEDs arranged along the LED lighting strip and electrically coupled at least to the first and second outer wires,
   wherein the first outer wire, the second outer wire and the at least one central wire comprise substantially semi-circle shaped bends in sections between at least some adjacent LEDs of the plurality of LEDs,
   wherein the bends in at least two of the first outer wire, the second outer wire and the at least one central wire face the same direction, and
   at least one of the bends in a different one of the first outer wire, the second outer wire and the at least one central wire face a different direction to maintain a minimum distance between the at least two outer wires and the at least one central wire to prevent electrical breakthrough therebetween; and
   an enclosing member enclosing the at least two outer wires, the at one central wire and the plurality of LEDs.

2. The LED lighting strip according to claim 1, wherein:
   the at least two outer wires and the at least one central wire are segmented, and
   the plurality of LEDS are connected between segments of the at least two outer wires and the at least one central wire.

3. The LED lighting strip according to claim 1, further comprising a plurality of carriers, wherein each of the plurality of LEDs is mounted on one of the plurality of carriers.

4. The LED lighting strip according to claim 3, wherein each of the plurality of carriers is coupled to each of the at least two outer wires and the at least one central wire.

5. The LED lighting strip according to claim 3, wherein:
   the at least two outer wires and the at least one central wire are segmented, and
   the plurality of carriers are connected between segments of the at least two outer wires and the at least one central wires.

6. The LED lighting strip according to claim 1, wherein the plurality of bends comprise circular arc shaped bends.

7. The LED lighting strip according to claim 6, wherein neighboring ones of the circular arc shaped bends are joined without a kink.

8. The LED lighting strip according to claim 6, wherein the plurality of bends comprise five circular arcs.

9. The LED lighting strip according to claim 1, wherein each of the at least two outer wires and the at least one central wire comprise a bend between at least some adjacent LEDs of the plurality of LEDs.

10. The LED lighting strip according to claim 9, wherein a shape of the at least two outer wires and the at least one central wire between the at least some adjacent LEDs of the plurality of LEDs are identical to each other.

11. The LED lighting strip according to claim 1, wherein the enclosing member comprises a silicone rubber.

12. The LED lighting strip according to claim 1, further comprising an electrical connector coupled to the outer wires.

13. The LED lighting strip according to claim 1, wherein:
   the plurality of LEDs are arranged in consecutive groups of consecutive LEDs,
   the consecutive LEDs in each consecutive group are, via the at least one central wire, in an electrical series connection between the at least two outer wires, and
   the consecutive groups are in an electrical parallel connection between the at least two outer wires.

14. A method of manufacturing a light-emitting diode (LED) lighting strip, the method comprising:
   arranging a plurality of wires such that at least one central wire is between a first outer wire and a second outer wire;
   arranging a plurality of LEDs along the LED lighting strip;
   electrically coupling the plurality of LEDs to at least the at least two outer wires;
   forming multiple substantially semi-circle shaped bends in the first and second outer wires and the at least one central wire in sections between at least some adjacent LEDs of the plurality of LEDs such that:
      the bends in at least two of the first outer wire, the second outer wire and the at least one central wire face the same direction, and
   at least one of the bends in a different one of the first outer wire, the second outer wire and the at least one central wire face a different direction to maintain a minimum distance between the at least two outer wires and the at least one central wire to prevent electrical breakthrough therebetween.

15. An automotive lighting system comprising:
   at least one light-emitting diode (LED) lighting strip comprising:
      a first outer wire and a second outer wire,
      at least one central wire between the first and second two outer wires,
      a plurality of LEDs arranged along the LED lighting strip and electrically coupled at least to the at least two outer wires,
      the at least two outer wires and the least one central wire comprising a plurality of bends in sections between at least some adjacent LEDs of the plurality of LED,
      wherein the bends in at least two of the first outer wire, the second outer wire and the at least one central wire face the same direction, and at least one of the bends in a different one of the first outer wire, the second outer wire and the at least one central wire face a different direction to maintain a minimum distance between the at least two outer wires and the at least one central wire to prevent electrical breakthrough therebetween;

an enclosing member enclosing the at least two outer wires, the at one central wire and the plurality of LEDs;

a driver configured to supply a current to the plurality of LEDs; and a controller configured to control the driver to turn the plurality of LEDs on and off either individually, all at a time, or in groups.

16. The automotive lighting system of claim 15, wherein the automotive lighting system is a signaling lighting system or a styling lighting system.

\* \* \* \* \*